(12) United States Patent
Huang

(10) Patent No.: US 7,177,230 B1
(45) Date of Patent: Feb. 13, 2007

(54) MEMORY CONTROLLER AND MEMORY SYSTEM

(75) Inventor: Hsiang-I Huang, Hsinchu (TW)

(73) Assignee: Mediatek Inc., Hsinchu (TW)

( * ) Notice: Subject to any disclaimer, the term of this patent is extended or adjusted under 35 U.S.C. 154(b) by 0 days.

(21) Appl. No.: 11/211,861

(22) Filed: Aug. 25, 2005

(51) Int. Cl.
*G11C 8/00* (2006.01)

(52) U.S. Cl. .................................. 365/233; 365/193

(58) Field of Classification Search ................ 365/233, 365/193, 191, 189.05
See application file for complete search history.

(56) References Cited

U.S. PATENT DOCUMENTS

| | | | | |
|---|---|---|---|---|
| 6,078,546 A | * | 6/2000 | Lee | 365/233 |
| 6,477,110 B2 | * | 11/2002 | Yoo et al. | 365/233 |
| 6,600,681 B1 | * | 7/2003 | Korger et al. | 365/193 |
| 6,603,706 B1 | | 8/2003 | Nystuen et al. | 365/233 |
| 6,785,189 B2 | | 8/2004 | Jacobs et al. | 365/233 |
| 7,032,092 B2 | * | 4/2006 | Lai | 711/167 |

* cited by examiner

*Primary Examiner*—Anh Phung
(74) *Attorney, Agent, or Firm*—Thomas, Kayden, Horstemeyer & Risley

(57) ABSTRACT

A memory controller. A first counter is triggered by rising edges of a data strobe signal and generates a first count value. A second counter is triggered by falling edges of the data strobe signal and generates a second count value. A third counter is triggered by rising edges of an internal clock and generates a third count value. A first buffer uses the first count value as a write address for sequential storage of the data corresponding to the rising edges of the data strobe signal, and sequential outputs the data corresponding to the third count value after a first predetermined period. A second buffer uses the second count value as the write address for sequential storage of the data corresponding to the falling edges of the data strobe signal, and sequential outputs the data corresponding to the third count value after the first predetermined period.

20 Claims, 7 Drawing Sheets

MEMORY CONTROLLER AND MEMORY SYSTEM

This patent application is related to a copending U.S. patent application Ser. No. 11/120,517, filed May. 2, 2005 and entitled "signal processing circuits and methods, and memory systems", and the entire contents of which are hereby provided by reference.

BACKGROUND

The disclosure relates in general to a memory controller. In particular, the disclosure relates to a memory controller for a double data rate (DDR) synchronous dynamic random access memory (SDRAM).

Certain types of memory devices generate a clock strobe signal having edges aligned with changes in the read data. A DDR SDRAM transfers data on each rising and falling edge of the clock strobe signal, thereby transferring two data words per clock cycle.

A read, data synchronization circuit is often used to coordinate the transfer of data to and from a memory device, such as a DDR SDRAM. The read data synchronization circuit provides a local clock signal to the memory device to synchronize read and write operations. The clock strobe signal generated by the memory device with the read data has predefined phase constraints with respect to the local clock signal provided by the read data synchronization circuit. The read data synchronization circuit uses the clock strobe signal to determine when the read data is valid and can therefore be latched. The times at which the read data is latched are preferably synchronized relative to the clock strobe signal so as to latch the read data in the middle of the valid data window.

Due to varying propagation delays from the read data synchronization circuit's local clock signal and the clock strobe signal received from the memory device, the phase relationship between the captured read data and the local clock signal from one device to the next and can change over time. These changes in phase alignment can be caused by input/output (I/O) pad delay variations, power supply fluctuations, process variations, temperature variations and variations in the clock input to data clock strobe output characteristics of the memory device. In certain cases these changes can be large enough to cause the captured read data to cross a metastable region with respect to the read data synchronization circuit's clock.

Due to these and other factors, accurate synchronization of captured read data to the read data synchronization circuit's clock requires the phase relationship between the data output clock strobe and the read data synchronization circuit clock to be maintained. Typically, a clock gating technique is employed which can introduce errors into data synchronization.

U.S. Pat. No. 6,603,706 to Nystuen provides a method and apparatus for synchronization of read data in a read data synchronization circuit, wherein programmable timing signals are provided for use in synchronizing read data.

However, the method and apparatus for synchronization of read data in a read data synchronization circuit provided by Nystuen requires a programmable logic to adjust latch points for reading data, and software or hardware programming the logic. In addition, since all bits on a bus may not be consentient, programmable logics are required for each bit of data accessing ports, increasing costs.

SUMMARY

An embodiment of a memory controller comprises a first counter triggered by rising edges of a data strobe signal and generating a first count value, a second counter triggered by falling edges of the data strobe signal and generating a second count value, a third counter triggered by rising edges of an internal clock and generating a third count value, a first buffer using the first count value as a write address for sequential storage of the data corresponding to the rising edges of the data strobe signal, and sequential output of the data corresponding to the third count value after a first predetermined period, a second buffer using the second count value as the write address for sequential storage of the data corresponding to the falling edges of the data strobe signal, and sequential output of the data corresponding to the third count value after the first predetermined period.

An embodiment of a memory system comprises a memory device operative to output data and data strobe signals synchronized with the data according to a memory access request, a memory controller operative to provide the memory access request, comprising a first counter triggered by rising edges of the data strobe signal and generating a first count value, a second counter triggered by falling edges of the data strobe signal and generating a second count value, a third counter triggered by rising edges of an internal clock and generating a third count value, a first buffer using the first count value as a write address for sequential storage of the data corresponding to the rising edges of the data strobe signal, and sequential output of the data corresponding to the third count value after a first predetermined period, and a second buffer using the second count value as the write address for sequential storage of the data corresponding to the falling edges of the data strobe signal, and sequential output of the data corresponding to the third count value after the first predetermined period.

BRIEF DESCRIPTION OF THE DRAWINGS

The invention will become more fully understood from the detailed description, given hereinbelow, and the accompanying drawings. The drawings and description are provided for purposes of illustration only and, thus, are not intended to be limiting of the present invention.

DETAILED DESCRIPTION

Figure 1:
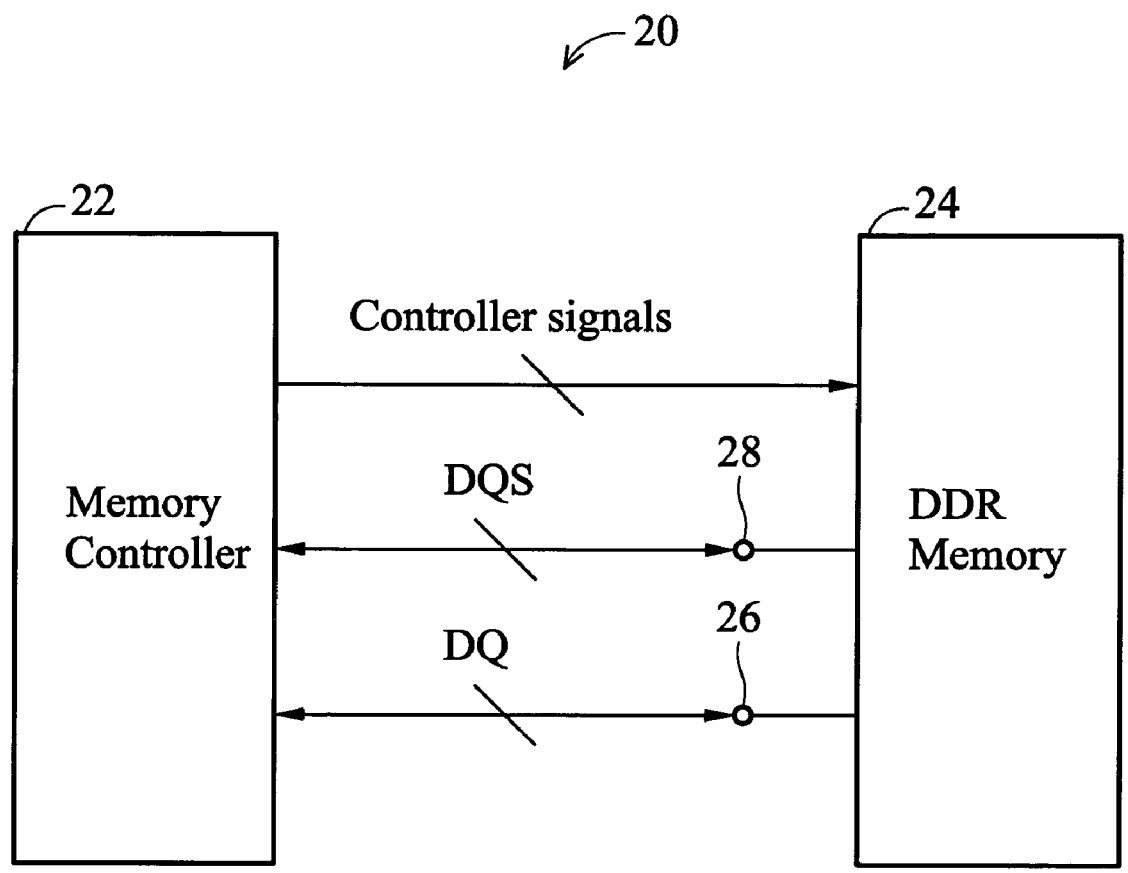
FIG. 1 is a block diagram of a memory system 20.

FIG. 1 is a block diagram of a memory system 20, comprising memory controller 22 and DDR memory 24. Memory controller 22 issues READ or WRITE commands to DDR memory through multiple control signals. After receiving the READ command, DDR memory 24 drives multiple data DQ and data strobe DQS respectively from DQ port 26 and DQS port 28 to memory controller 22.

Memory controller 22 uses DOS to sample signal DQ to obtain read memory data. Normally, one DOS signal samples 4 or 8 DQ signals.

Figure 2:
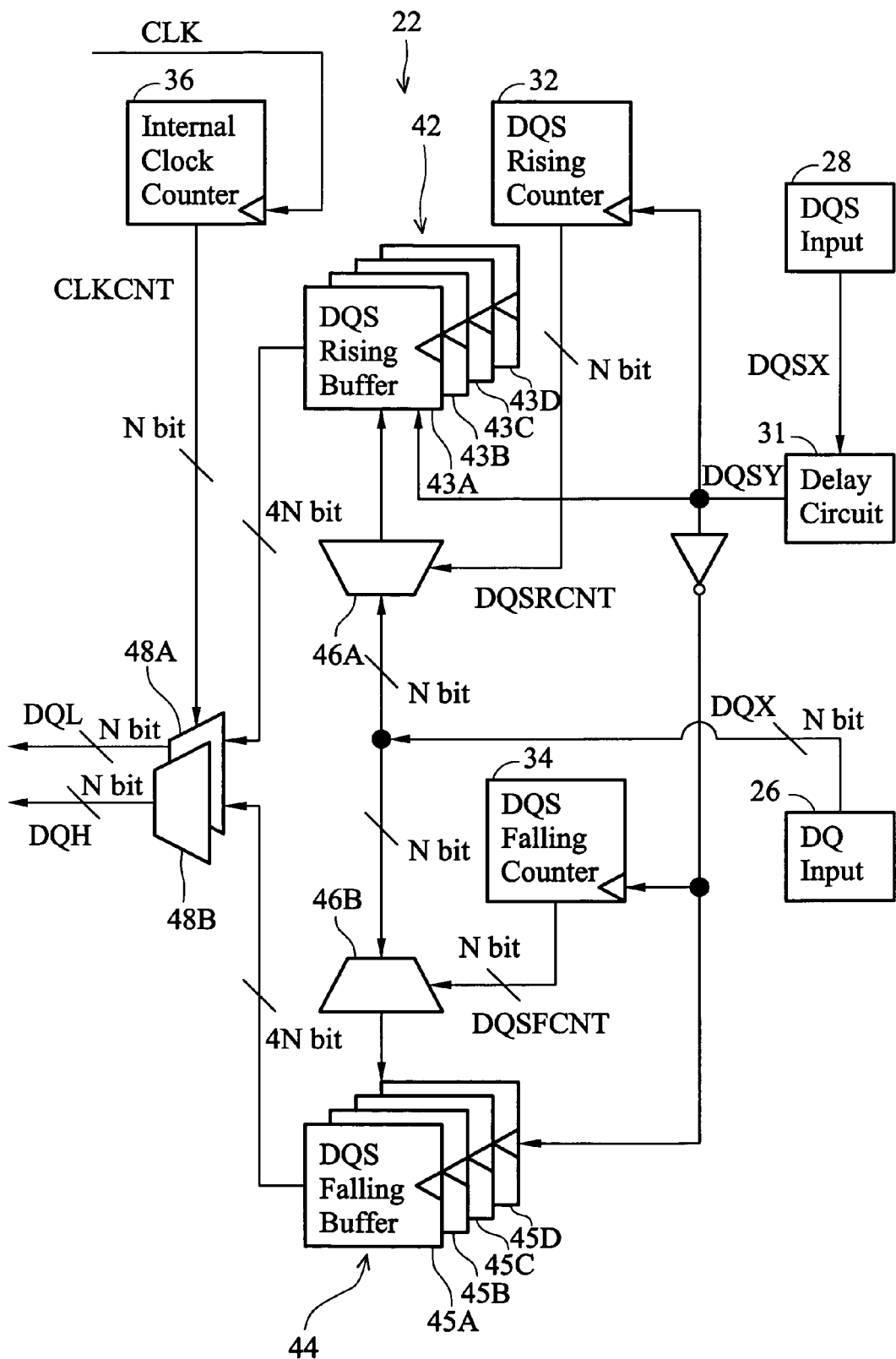
FIG. 2 is a block diagram of a memory controller 22 according to an embodiment of the invention.
Figure 3:
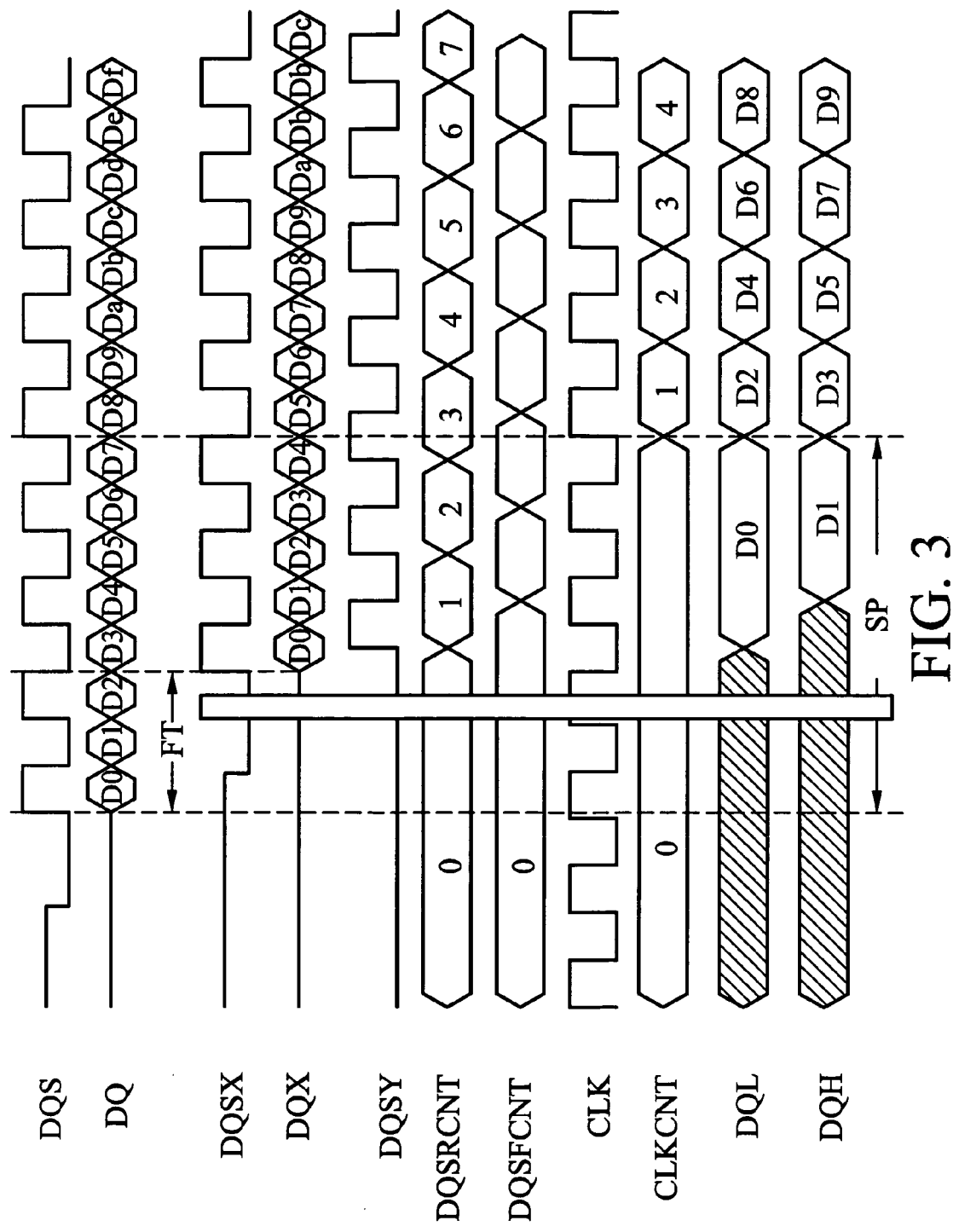
FIG. 3 is a timing diagram of the memory controller 22 according to an embodiment.

FIG. 2 is a block diagram of memory controller 22 according to an embodiment of the invention. FIG. 3 is a timing diagram of memory controller 22 according to an embodiment of the invention.

The data strobe DOS is provided by memory controller 22 and driven from DDR memory 24, passing through-system PCB, IC subtract, I/O PAD, and any inter-media between DDR memory 24 and memory controller 22 to reach memory controller 22. Thus, DQ port 26 and DQS port 28 of DDR memory 24 respectively provide data DQX and data strobe DQSX to memory controller 22 delayed by a predetermined period FT, the total delay for data DQ and data strobe DQS passing through the all inter-media between memory controller 22 and DDR memory 24. It is noted that predetermined period FT can be further varied by uncertain factors, such as skew between data strobe DQS and clock due to DDR memory 24 or PCB layout, and working condition and process variation of memory controller 22. In addition, a delay circuit 31 is provided to delay the data strobe DQSX to signal DQSY by about a quarter of cycle to meet timing requirements.

DQS rising counter 32 is triggered by rising edges of the delayed data strobe signal DQSY and generates first count value DQSRCNT corresponding to the number of rising edges of the delayed data strobe signal DQSY. DQS falling counter 34 is triggered by falling edges of the delayed data strobe signal DQSY and generates second count value DQSFCNT corresponding to the number of falling edges of the delayed data strobe signal DQSY. Internal clock counter 36 is triggered by rising edges of internal clock CLK and generates third count value CLKCNT corresponding to the number of rising edges of the internal clock CLK.

DQS rising buffer 42 and DQS falling buffer 44 each comprise a plurality of buffer entries (43A~43D and 45A~45D) indexed by sequential integral index. In an embodiment of the invention, DQS rising buffer 42 and DQS falling buffer 44 can be achieved by flip flops. FIG. 2 shows respectively four buffer entries in DQS rising buffer 42 and DQS falling buffer 44 as an example. In fact, the number of buffer entries in DQS rising buffer 42 and DQS falling buffer 44 can be set by any natural number in accordance with hardware requirements.

Figure 4:
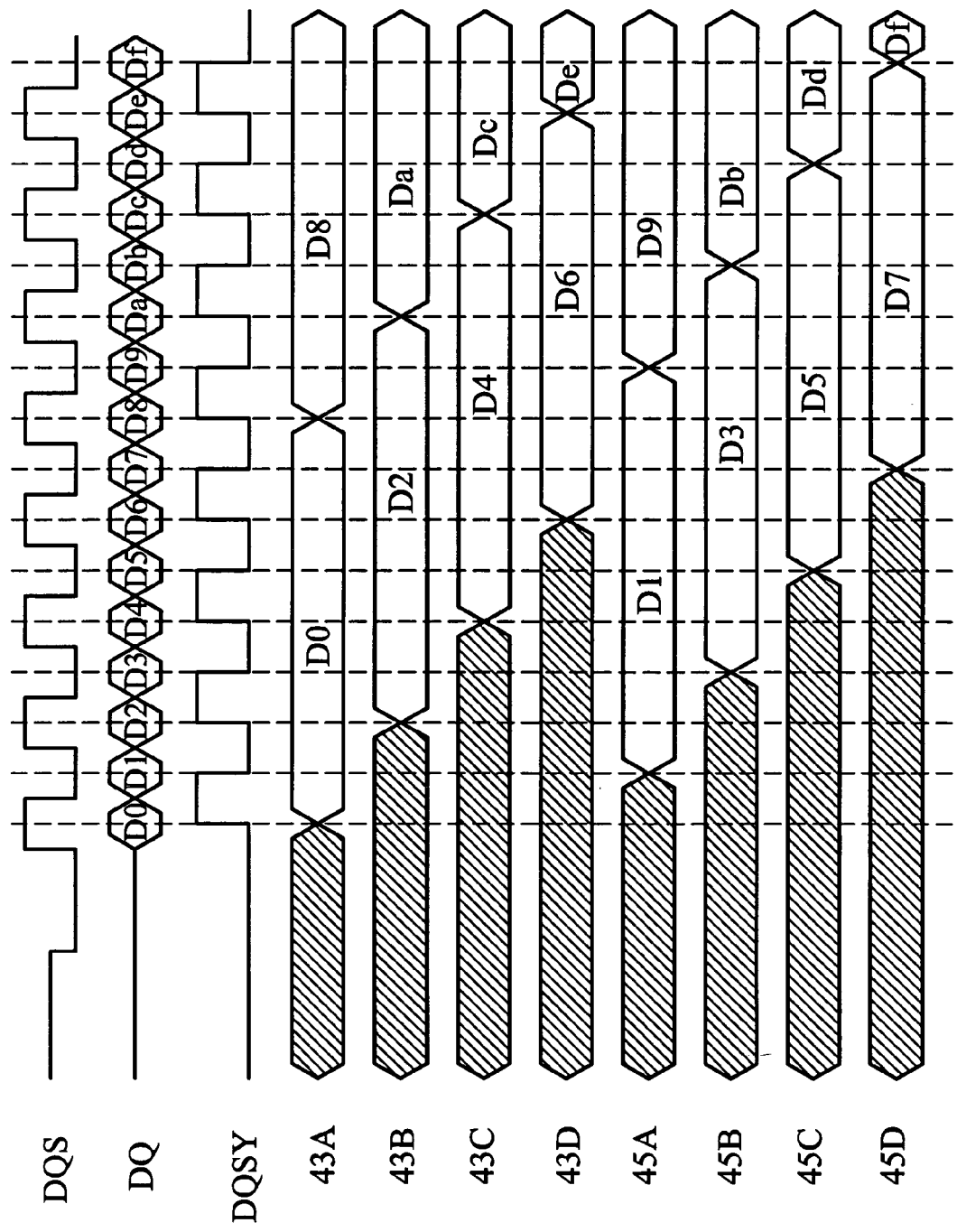
FIG. 4 is a timing diagram of a DQS rising buffer 42 and DQS falling buffer 44 according to an embodiment.

DQS rising buffer 42 uses first count value DQSRCNT as write address for sequential storage of the data DQX corresponding to the rising edges of the data strobe DQSY to its buffer entries with corresponding index through demulitplexer 46A. DQS falling buffer 44 uses second count value DQSFCNT as the write address for sequential storage of the data DQX corresponding to the falling edges of the data strobe DQSY to its buffer entries with corresponding index through multiplexer 46B. Thus, D0 is written to entry 0 (43A) of DQS rising buffer 42, D1 to entry 0 (45A) of DOS falling buffer 44, D2 to entry 1 (43B) of DOS rising buffer 42, D3 to entry 1 (45B) of DOS falling buffer 44, and so on, as shown in FIG. 4.

After the predetermined period SP, DQS rising buffer 42 sequentially outputs data DQX from its buffer entries with the index corresponding to third count value CLKCNT through multiplexer 48A after predetermined period SP. DQS falling buffer 44 sequentially outputs the data DQX from buffer entries with the index corresponding to third count value CLKCNT through multiplexer 48B after predetermined period SP. In FIG. 2, signals DQL and DQH are output respectively from multiplexers 48A and 48B. Here, the predetermined period SP exceeds predetermined period FT. In addition, predetermined period SP can be set a relatively high value initially if predetermined period FT is not obtained correctly. It is noted that data DQX in the DQS rising buffer 42 and DOS falling buffer 44 cannot be overwritten before being read out by memory controller 22.

Figure 5A:
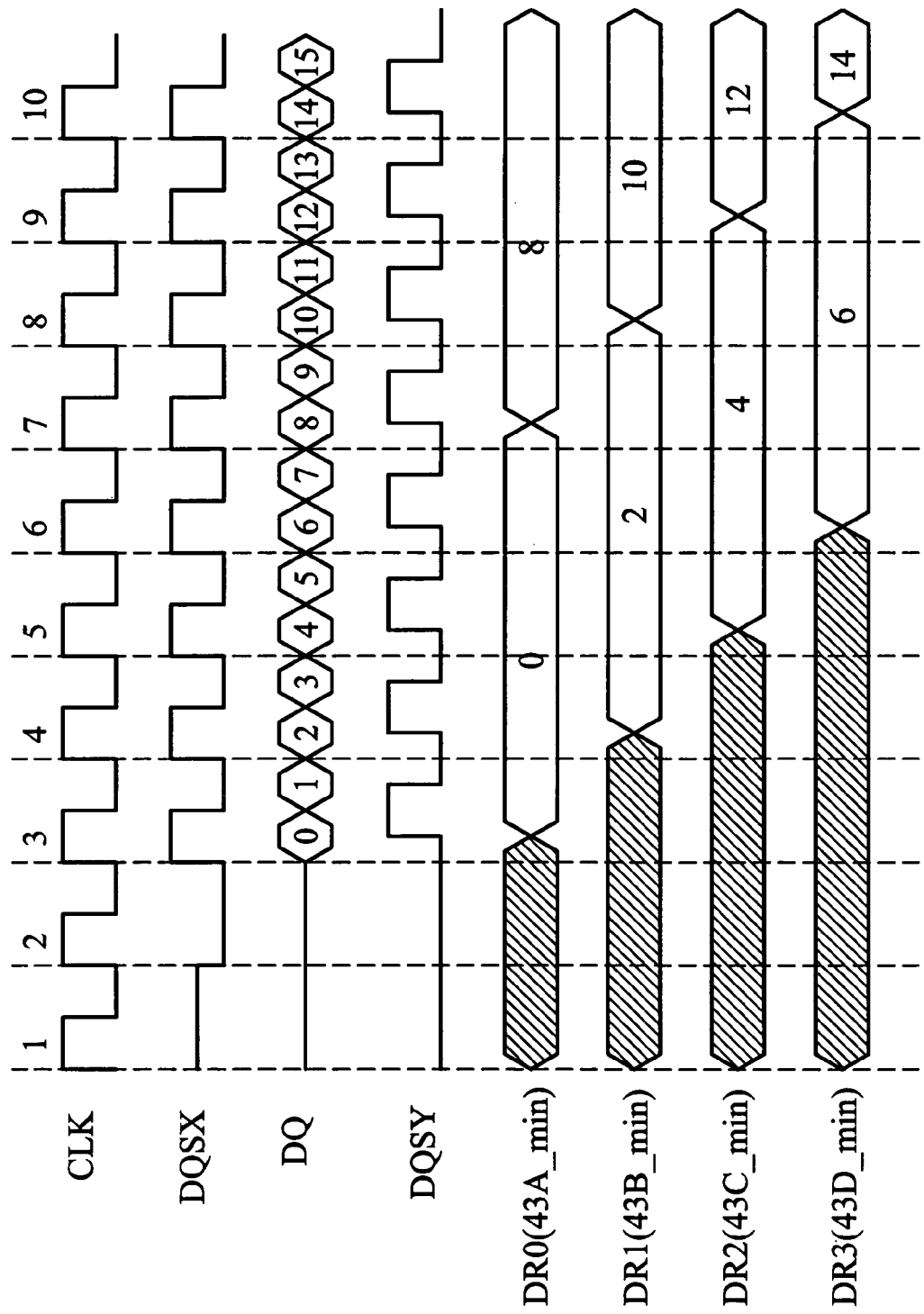
FIGS. 5A and 5B are respective timing diagrams of DQS rising buffer 42 with different data latencies.
Figure 5B:
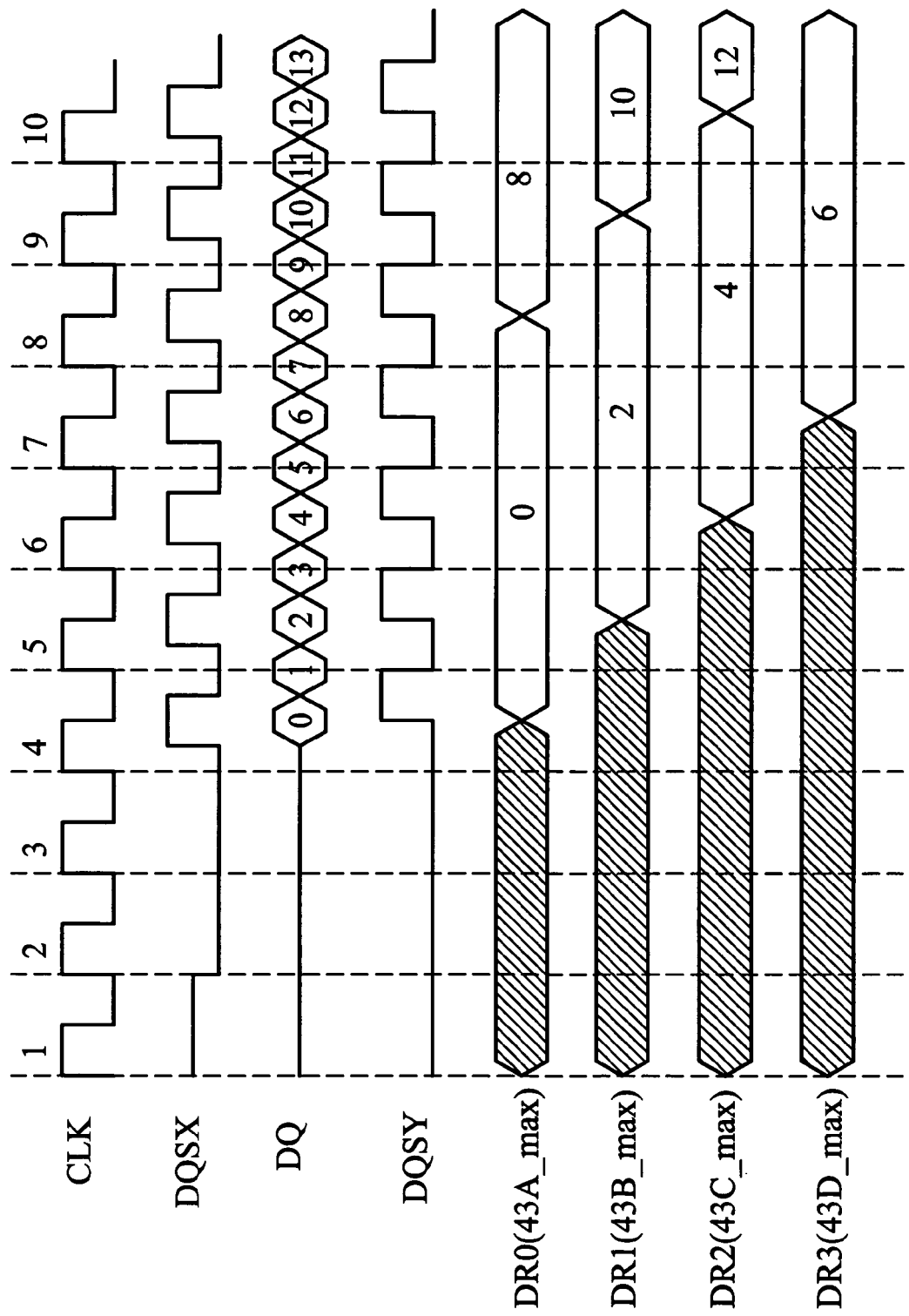

FIGS. 5A and 5B are respective timing diagrams of DQS rising buffer 42 with different data latencies, where FIG. 5A shows timing with smallest practice data latency, and FIG. 5B shows that with largest available practice data latency. Using there is one clock cycle between the smallest and the largest practice data latency as an example, the first rising edge of data strobe DQSX shown in FIG. 5A is at clock cycle 3, and that shown in FIG. 5B is at clock cycle 4. It is noted that the timing of DQS falling buffer 42 may be similar to that of FIGS. 5A and 5B, but with a phase shifted on the stored data.

Figure 6:
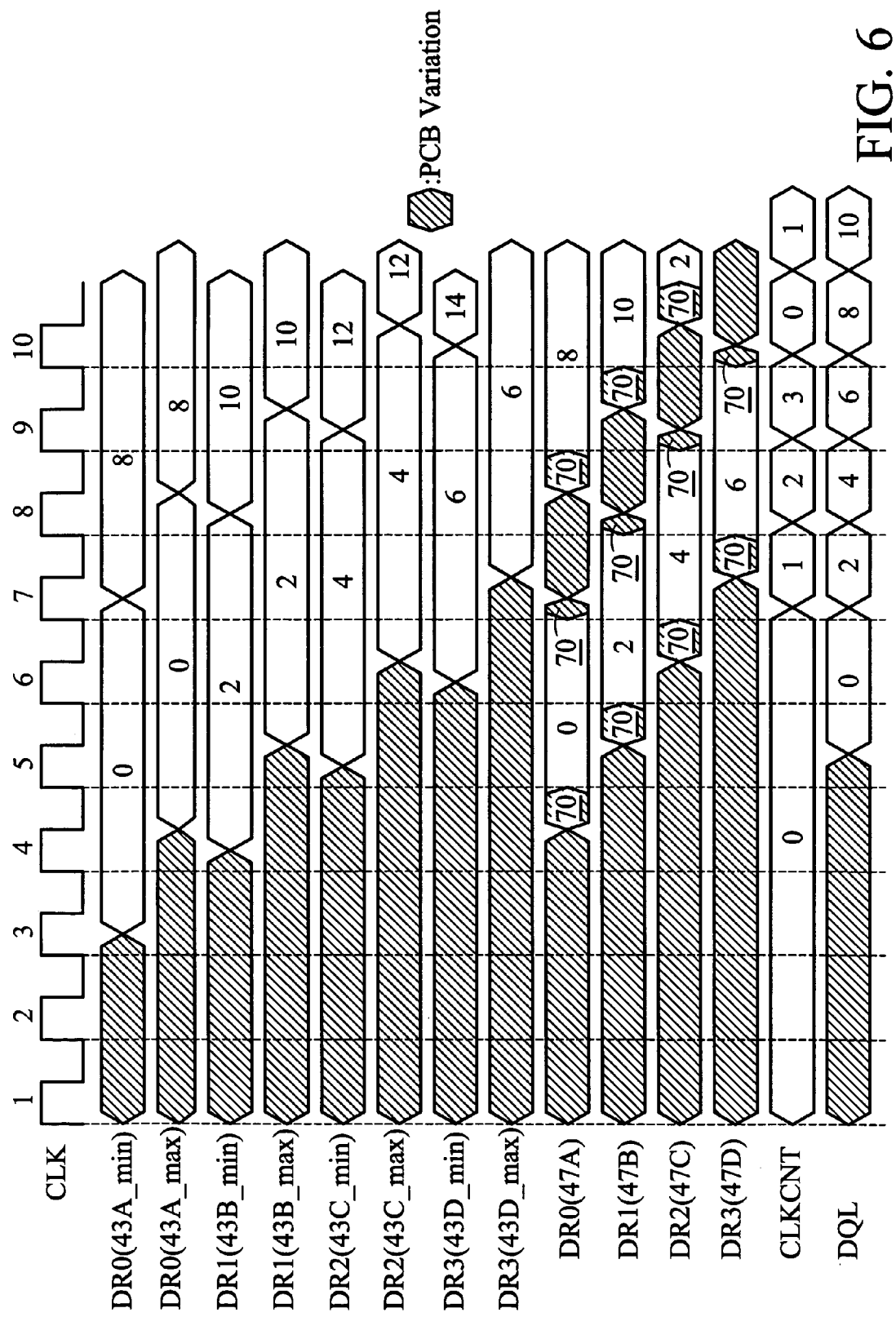
FIG. 6 shows the timing of DQS rising buffer 42 combined with FIGS. 5A and 5B.

FIG. 6 shows the timing of DQS rising buffer 42 combined with FIGS. 5A and 5B. In FIG. 6, DR0(47A), DR1 (47B), DR2(47C), and DR3(47D) show the available period for output of data stored in DQS rising buffer 42. In addition, intervals 70 allow further timing variations for the memory controller 22, such as PCB delay.

Accordingly, predetermined period SP can be reduced to improve data latency according to real system environment. In addition, predetermined period FT variation from 0 to multiple clock cycles is allowable, improving error allowance. In addition, the circuit disclosed in the embodiments of the invention can be utilized in other types of source synchronous bus, such as 1394 bus, Universal Serial Bus (USB), Advanced Technology Attachment (ATA), or Accelerated Graphics Port (AGP) interface.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory controller for a memory device outputting data and a data strobe signal synchronized with the data according to a memory access request, comprising:
   a first counter triggered by rising edges of the data strobe signal and generating a first count value;
   a second counter triggered by falling edges of the data strobe signal and generating a second count value;
   a third counter triggered by rising edges of an internal clock and generating a third count value;
   a first buffer using the first count value as a write address for sequential storage of the data corresponding to the rising edges of the data strobe signal, and sequential output of the data corresponding to the third count value after a first predetermined period; and
   a second buffer using the second count value as the write address for sequential storage of the data corresponding to the falling edges of the data strobe signal, and sequential output of the data corresponding to the third count value after the first predetermined period.

2. The memory controller as claimed in claim 1, wherein the data and the data strobe signal are delayed by a second predetermined period in any intra-media between memory and memory controller.

3. The memory controller as claimed in claim 2, further comprising a delay circuit operative to delay the data strobe signal by a third predetermined period.

4. The memory controller as claimed in claim 2, wherein the first predetermined period exceeds the second predetermined period.

5. The memory controller as claimed in claim 1, wherein the first buffer comprises a plurality of first buffer entries indexed by sequential integral index.

6. The memory controller as claimed in claim 5, wherein the first buffer stores the data corresponding to the rising edges of the data strobe signal to the first buffer entries with corresponding index.

7. The memory controller as claimed in claim 5, wherein the first buffer outputs data from the first buffer entries with the index corresponding to the third count value.

8. The memory controller as claimed in claim 1, wherein the second buffer comprises a plurality of second buffer entries indexed by sequential integral index.

9. The memory controller as claimed in claim 8, wherein the second buffer stores the data corresponding to the falling edges of the data strobe signal to the second buffer entries with corresponding index.

10. The memory controller as claimed in claim 8, wherein the second buffer outputs data from the second buffer entries with the index corresponding to the third count value.

11. A memory system, comprising:
a memory device operative to output data and data strobe signals synchronized with the data according to a memory access request;
a memory controller operative to provide the memory access request, comprising:
a first counter triggered by rising edges of the data strobe signal and generating a first count value;
a second counter triggered by falling edges of the data strobe signal and generating a second count value;
a third counter triggered by rising edges of an internal clock and generating a third count value;
a first buffer using the first count value as a write address for sequential storage of the data corresponding to the rising edges of the data strobe signal, and sequential output of the data corresponding to the third count value after a first predetermined period; and
a second buffer using the second count value as the write address for sequential storage of the data corresponding to the falling edges of the data strobe signal, and sequential output of the data corresponding to the third count value after the first predetermined period.

12. The memory system as claimed in claim 11, wherein the data and the data strobe signal are delayed by a second predetermined period in any intra-media between memory and memory controller.

13. The memory system as claimed in claim 12, further comprising a delay circuit operative to delay the data strobe signal by a third predetermined period.

14. The memory system as claimed in claim 12, wherein the first predetermined period exceeds the second predetermined period.

15. The memory system as claimed in claim 11, wherein the first buffer comprises a plurality of first buffer entries indexed by sequential integral index.

16. The memory system as claimed in claim 15, wherein the first buffer stores the data corresponding to the rising edges of the data strobe signal to the first buffer entries with corresponding index.

17. The memory system as claimed in claim 15, wherein the first buffer outputs data from the first buffer entries with the index corresponding to the third count value.

18. The memory system as claimed in claim 11, wherein the second buffer comprises a plurality of second buffer entries indexed by sequential integral index.

19. The memory system as claimed in claim 18, wherein the second buffer stores the data corresponding to the falling edges of the data strobe signal to the second buffer entries with corresponding index.

20. The memory system as claimed in claim 18, wherein the second buffer outputs data from the second buffer entries with the index corresponding to the third count value.

* * * * *